USO10177300B2

(12) United States Patent
Fukuoka et al.

(10) Patent No.: US 10,177,300 B2
(45) Date of Patent: Jan. 8, 2019

(54) PIEZOELECTRIC CERAMIC, MANUFACTURING METHOD THEREFOR, AND ELECTRONIC COMPONENT

(71) Applicant: KYOCERA Corporation, Kyoto-shi, Kyoto (JP)

(72) Inventors: Shuichi Fukuoka, Kirishima (JP); Tomonori Eguchi, Kagoshima (JP); Hitoshi Nakakubo, Kirishima (JP)

(73) Assignee: KYOCERA CORPORATION, Kyoto (JP)

(*) Notice: Subject to any disclaimer, the term of this patent is extended or adjusted under 35 U.S.C. 154(b) by 394 days.

(21) Appl. No.: 15/032,328

(22) PCT Filed: Aug. 29, 2015

(86) PCT No.: PCT/JP2015/074551
§ 371 (c)(1),
(2) Date: Apr. 27, 2016

(87) PCT Pub. No.: WO2016/031995
PCT Pub. Date: Mar. 3, 2016

(65) Prior Publication Data
US 2016/0293831 A1 Oct. 6, 2016

(30) Foreign Application Priority Data

Aug. 29, 2014 (JP) .................................. 2014-175767

(51) Int. Cl.
*H01L 41/187* (2006.01)
*C04B 35/493* (2006.01)
(Continued)

(52) U.S. Cl.
CPC ........ *H01L 41/1876* (2013.01); *C04B 35/493* (2013.01); *H01L 41/0471* (2013.01);
(Continued)

(58) Field of Classification Search
CPC ............... H01L 41/187; H01L 41/1876; H01L 41/1878
(Continued)

(56) References Cited

U.S. PATENT DOCUMENTS 5,402,791 A * 4/1995 Saitoh .................. B06B 1/0648
252/62.9 PZ
7,948,153 B1 5/2011 Kellogg et al.
(Continued)

FOREIGN PATENT DOCUMENTS

CN 1702057 A 11/2005
CN 102531638 A 7/2012
(Continued)

OTHER PUBLICATIONS

Extended European Search Report, European Patent Application No. 15835045.4, dated Oct. 24, 2017, 13 pgs.
(Continued)

*Primary Examiner* — Derek Rosenau
(74) *Attorney, Agent, or Firm* — Volpe and Koenig, P.C.

(57) ABSTRACT

A piezoelectric ceramic may be slightly deformed by firing, and a manufacturing method therefor, and an electronic component are disclosed. There is provided a piezoelectric ceramic including a plurality of crystal grains including a lead zirconate titanate-type crystal containing Zn, and Bi, and crystal grain boundaries existing between a plurality of the crystal grains, wherein a plurality of the crystal grains include first crystal grains, and wherein the first crystal grains have a content of at least one element of Zn and Bi present in the inside of the first crystal grains that is smaller than the content of the at least one element present in an area including the crystal grain boundaries that are in contact with the crystal grains. The piezoelectric ceramic is slightly
(Continued)

deformed by firing and is capable of forming an electronic component which has little warp or deformation even if it is thin.

8 Claims, 5 Drawing Sheets

(51) Int. Cl.
*H01L 41/43* (2013.01)
*H01L 41/297* (2013.01)
*H01L 41/047* (2006.01)
*H01L 41/277* (2013.01)
*H01L 41/083* (2006.01)
*H01L 41/273* (2013.01)

(52) U.S. Cl.
CPC ........ *H01L 41/0475* (2013.01); *H01L 41/277* (2013.01); *H01L 41/297* (2013.01); *H01L 41/43* (2013.01); *H01L 41/083* (2013.01); *H01L 41/273* (2013.01)

(58) Field of Classification Search
USPC ................. 310/358; 252/62.9 R, 62.9 PZ
See application file for complete search history.

(56) References Cited

U.S. PATENT DOCUMENTS

| | | |
|---|---|---|
| 2002/0084724 A1 | 7/2002 | Morinaga et al. |
| 2004/0222719 A1 | 11/2004 | Sasaki et al. |
| 2004/0262037 A1 | 12/2004 | Shizuno et al. |
| 2009/0200898 A1* | 8/2009 | Sakaki .................. C04B 35/493 310/358 |
| 2014/0068904 A1 | 3/2014 | Ebigase et al. |

FOREIGN PATENT DOCUMENTS

| | | |
|---|---|---|
| DE | 4127829 A1 | 3/1993 |
| EP | 1547989 A1 | 6/2005 |
| EP | 2833424 A1 | 2/2015 |
| JP | 03-54878 A | 3/1991 |
| JP | 04-298085 A | 10/1992 |
| JP | 04-325464 A | 11/1992 |
| JP | 05-55661 A | 3/1993 |
| JP | 07-045124 A | 2/1995 |
| JP | 2000-086341 A | 3/2000 |
| JP | 2010-222170 A | 10/2010 |
| JP | 2011-029537 A | 2/2011 |
| JP | 2011-068535 A | 4/2011 |
| JP | 2011-241105 A | 12/2011 |
| JP | 2013-211350 A | 10/2013 |
| WO | 2004/026789 A1 | 4/2004 |
| WO | 2013/146975 A1 | 10/2013 |

OTHER PUBLICATIONS

International Search Report, PCT/JP2015/074549, dated Dec. 1, 2015, 2 pgs.
Chinese Office Action with English concise explanation, Chinese Patent Application No. 201580002390.9, dated Jan. 16, 2017, 13 pgs.
J. Bi et al., "Processing and Properties of Special Ceramics," Materials Science and Engineering series, Harbin Institute of Technology Press, Mar. 2008, 3 pgs. with English translation.
Extended European Search Report, European Patent Application No. 15835935.6, dated Jul. 24, 2017, 9 pgs.
International Search Report, PCT/JP2015/074551, dated Dec. 1, 2015, 1 pg.
Chinese Office Action with English concise explanation, Chinese Patent Application No. 201580002303.X, dated Jan. 9, 2017, 10 pgs.

* cited by examiner

PIEZOELECTRIC CERAMIC, MANUFACTURING METHOD THEREFOR, AND ELECTRONIC COMPONENT

TECHNICAL FIELD

The present invention relates to a piezoelectric ceramic, a method for manufacturing therefor, and an electronic component.

BACKGROUND ART

Piezoelectric ceramics are used for a variety of electronic components, such as a piezoelectric actuator, which utilize, as a mechanical driving source, displacement or force generated via a piezoelectric phenomenon. With broadened use of piezoelectric actuators, multi-layer piezoelectric actuators from which larger displacement or larger generated force can be obtained at lower voltages have become increasingly used. Generally, piezoelectric actuators are desired in their functional aspect to have large piezoelectric strain constants, especially a large $d_{33}$ constant and a large $d_{31}$ constant as much as possible, and it is also important that they do not degrade in insulation properties during their continuous driving.

As a piezoelectric ceramic composition suitable for such purposes, there is known a composition the formula of which expressed in molar ratio is $Pb_{1-x-y}Sr_xBa_y(Zn_{1/3}Sb_{2/3})_a Zr_bTi_{1-a-b}O_3$, wherein x, y, a and b satisfy $0 \leq x \leq 0.14$, $0 \leq y \leq 0.14$, $0.04 \leq x+y$, $0.01 \leq a \leq 0.12$ and $0.43 \leq b \leq 0.58$ (see, for example, Patent Document 1), and it is described that such a piezoelectric ceramic composition is fired at 1240 to 1300° C.

Moreover, as piezoelectric ceramic compositions capable of being fired at low temperature, there are known a piezoelectric ceramic composition containing $PbZrO_3$—$PbTiO_3$—$Pb(Zn_{1/3}Sb_{2/3})O_3$ as a main component, containing elements Bi and Fe in an amount of 5 to 15% by mass in terms of $BiFeO_3$, and having been fired at 1000 to 1100° C., and a piezoelectric ceramic composition containing Li, Bi and at least one of Cd, B, Pb, Si and Zn in addition to the above-mentioned main component and having been fired at 900 to 1000° C. (see, for example, Patent Document 2).

Patent Document 3 discloses a multi-layer electronic component including a piezoelectric ceramic made of crystal grains of a lead zirconate titanate-type crystal containing at least one of Sb and Nb, Zn, and Bi, and an internal electrode layer containing Ag as a main component, and a manufacturing method therefor including adding a $Bi_2O_3$ powder to a calcined powder containing at least one of Sb and Nb, Pb, Zr, Ti, and Zn, followed by firing at 920 to 960° C.

PRIOR ART DOCUMENT

Patent Documents

Patent Document 1: Japanese Unexamined Patent Publication No. 7-45124
Patent Document 2: Japanese Unexamined Patent Publication No. 2000-86341
Patent Document 3: Japanese Unexamined Patent Publication No. 2011-29537

SUMMARY OF THE INVENTION

Problem to be Solved by the Invention

However, since the piezoelectric ceramic compositions disclosed in Patent Documents 1 to 3 develop large deformation on firing, especially thin piezoelectric ceramics suffer from deficiencies such as generation of warp and generation of fracture or cracks during processing.

It is an object of the present invention to provide a piezoelectric ceramic which is slightly deformed by firing, a method for manufacturing therefor, and an electronic component.

Means for Solving the Problems

The piezoelectric ceramic of the present invention includes a plurality of crystal grains including a lead zirconate titanate-type crystal containing Zn and Bi, and crystal grain boundaries existing between a plurality of the crystal grains, wherein a plurality of the crystal grains include first crystal grains, and wherein the first crystal grains have a content of at least one element of Zn and Bi present in the inside of the first crystal grains that is smaller than the content of the at least one element present in an area including the crystal grain boundaries that are in contact with the first crystal grains.

The method of the present invention for manufacturing a piezoelectric ceramic includes the steps of: preparing a calcined powder containing Pb, Zr, Ti, and Zn, preparing a mixed powder of the calcined powder and an oxide powder containing Zn and Bi, forming the mixed powder into a compact, and firing the compact at 900 to 1050° C. in the atmosphere.

The electronic component of the present invention includes a piezoelectric body made of the above-mentioned piezoelectric ceramic and an electrode layer.

Effect of the Invention

According to the present invention, there can be provided a piezoelectric ceramic which is slightly deformed by firing, a method for manufacturing therefor, and an electronic component.

EMBODIMENTS FOR CARRYING OUT THE INVENTION

Figure 1:
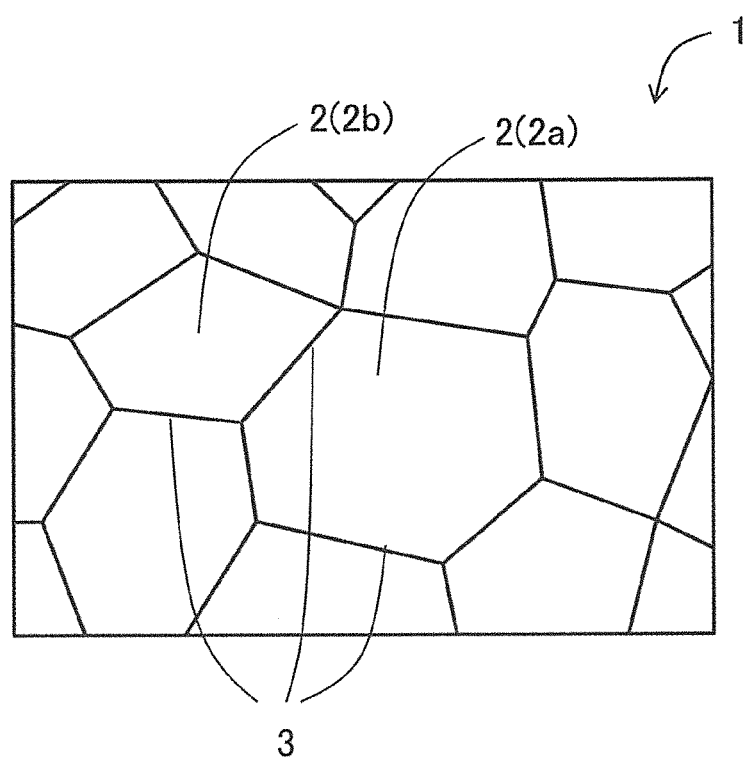
FIG. 1 is a cross-sectional view schematically illustrating a structure of a piezoelectric ceramic.

One embodiment of a piezoelectric ceramic is described with reference to drawings. A piezoelectric ceramic 1 of this embodiment is a material including a plurality of crystal grains 2 including a lead zirconate titanate-type crystal (henceforth also simply referred to as a PZT-type crystal) containing Zn and Bi, and crystal grain boundaries 3 existing between the crystal grains 2 as illustrated in FIG. 1, or alternatively, it may be a material consisting of the crystal grains 2 and the crystal grain boundaries 3.

The crystal grains 2 include crystal grains 2 in which Ci is less than Cb (Ci<Cb) in local elemental analysis performed at the inside of the crystal grain 2 and at an area including the crystal grain boundary 3 (henceforth sometimes referred to as "on a crystal grain boundary 3") both located in a cross section of the piezoelectric ceramic 1, followed by comparison of the content Ci of at least one element of Zn and Bi at the inside of the crystal grain 2 with the content Cb thereof at the crystal grain boundary 3 adjoining the crystal grain 2. Regarding at least one element of Zn and Bi, a crystal grain 2 in which Ci is less than Cb is called a "first crystal grain 2a" and a crystal grain 2 in which there is no difference between Ci and Cb for both Zn and Bi or Ci is greater than Cb (Ci≥Cb) is called a "second crystal grain 2b." In other words, the first crystal grain 2a is a crystal grain in which the content of at least one of Zn and Bi is greater on the crystal grain boundary 3 than that at the inside of the first crystal grain 2a in local elemental analysis performed at the inside of the first crystal grain 2 and on the crystal grain boundary 3 adjoining the first crystal grain 2a, followed by comparison of their content of Zn and Bi.

Unlike conventional PZT-type piezoelectric ceramics, in the piezoelectric ceramic 1, the crystal grain boundaries 3 contain substantially no amorphous phase containing Li, B or the like, which is a component to accelerate sintering, or substantially no crystal phase other than PZT-type crystals (heterogeneous phase). Accordingly, the piezoelectric ceramic 1 is small in change with time of insulation resistance and deterioration of piezoelectric properties both caused by persistence of those phases. Moreover, the piezoelectric ceramic 1 exhibits small deformation even if it is of a shape small in thickness and densified as described below.

The content of Zn and Bi at the inside of the crystal grain 2 and that at the crystal grain boundary 3 can be determined, for example, by observing a cross section of the piezoelectric ceramic 1 with a scanning electron microscope (SEM) or a transmission electron microscope (TEM), and then performing local elemental analysis of Zn and Bi at the inside of the crystal grain 2 and at the crystal grain boundary 3 adjoining the crystal grain 2.

The local elemental analysis may be performed, for example, by using energy dispersive X-ray spectroscopy (EDS), a field emission electron probe micro analyzer (FE-EPMA), Auger electron spectrometry (AES), a transmission electron microscope (TEM), or the like. Herein, the content of Zn and Bi at the inside of the crystal grain 2 means, for example, the content of Zn and Bi detected by elemental analysis of the center (area centroid of a cross section) of the crystal grain 2, and the content of Zn and Bi in an area including crystal grain boundaries 3 means the content of Zn and Bi detected by elemental analysis of the crystal grain boundary 3 of the crystal grain 2 and a vicinity thereof.

The above-mentioned elemental analyzers differ in spatial resolution; for example, when a transmission electron microscope (TEM) is used, its spatial resolution is a few nanometers, and when Auger electron spectrometry (AES) is used, its spatial resolution is several tens of nanometers. Therefore, the measurement performed on the crystal grain boundary 3 substantially results in the comparison of the result measured at the crystal grain boundary 3 and a vicinity thereof as far as a few nanometers (TEM) or a several tens of nanometers (AES) with the result measured at the center of the crystal grain 2. Although the center (the area centroid of a cross section) of the crystal grain 2 has been taken as an example of a measurement point of the inside of the crystal grain 2, an area where the distance from the crystal grain boundary 3 is equal to or greater than the spatial resolution of an elemental analyzer in the crystal grain 2 may be analyzed and assessed as the inside of the crystal grain 2 when an elemental analyzer with high spatial resolution, such as a TEM, is used.

The piezoelectric ceramic 1 of this embodiment includes a crystal grain boundary 3 with a thickness of 10 nm or less (about 1 to 5 nm), and it is expected that the elemental analysis performed on the crystal grain boundary 3 includes information of the inside of a crystal grain 2 at least a few nanometers away from the crystal grain boundary 3, namely, information of a vicinity of the crystal grain boundary 3 of the crystal grain 2, which is at the very surface of the crystal grain 2. In other words, it is expected that the first crystal grain 2a in the piezoelectric ceramic 1 of this embodiment has a layer that is rich in at least one of Zn and Bi at the immediate vicinity of the crystal grain boundary 3 (in the vicinity of the surface of the crystal grain 2) and the thickness of the layer is expected to be a few nanometers. Accordingly, the area including a crystal grain boundary 3 as referred to herein shall include a surface layer of a crystal grain 2 extending within a few nanometers from the crystal grain boundary 3.

The measurement of elemental analysis can be performed, for one crystal grain 2, at least at one point within the crystal grain 2 and at one point within an area including a crystal grain boundary 3 (a grain boundary located between two planes or a triple point) located closest to the measurement point within the crystal grain 2, followed by comparison of the measurements.

When the Zn content within the crystal grain 2 is denoted by Ci(Zn) and the Zn content in the area including a crystal grain boundary 3 adjoining the crystal grain 2 is denoted by Cb(Zn), it is preferable in the first crystal grain 2a that the ratio of Cb(Zn) to Ci(Zn) (Cb(Zn)/Ci(Zn)) is not less than 1.04 and not more than 2.0 in mass ratio.

Moreover, when the Bi content within the crystal grain 2 is denoted by Ci(Bi) and the Bi content in the area including a crystal grain boundary 3 adjoining the crystal grain 2 is denoted by Cb(Bi), it is preferable in the first crystal grain 2a that the ratio of Cb(Bi) to Ci(Bi) (Cb(Bi)/Ci(Bi)) is 1.03 or more, even 1.05 or more, in mass ratio. Such ratios make it possible to achieve densification at low temperature. (Cb(Bi)/Ci(Bi)) is preferably 2.0 or less, even 1.8 or less, in mass ratio.

Especially, if the content of Bi in an area including the crystal grain boundaries 3 of the piezoelectric ceramic 1, Cb(Bi), is excessively large relative to the content of Bi inside the crystal grain 2a, Ci(Bi), the DC bias resistance under a highly humid environment may deteriorate and the insulation properties may deteriorate. However, adjustment of the Bi content ratio of the area including the crystal grain boundaries 3 to the inside of the first crystal grain 2a (Cb(Bi)/Ci(Bi)) to such a ratio makes it possible to render the content of Bi in the crystal grain boundaries 3 low and inhibit deterioration of the insulation properties under a highly humid environment.

The percentage of the first crystal grains 2a is preferably 80% or more of the crystal grains 2 constituting the piezoelectric ceramic 1 as expressed by the ratio of the number of the first crystal grains 2a to the total number of the first crystal grains 2a and the second crystal grains 2b (henceforth referred to as the number of the crystal grains 2). Adjusting the percentage of the first crystal grains 2a to 80% or more or even 90% or more affords a piezoelectric ceramic 1 that slightly deforms even if it is densified in a thin shape and contains a small amount of amorphous phase or heterogeneous phase.

The percentage of the first crystal grains 2a in the crystal grains 2 composed of the first crystal grains 2a and the second crystal grains 2b can be determined by extracting at least 10 arbitrary crystal grains 2 through observation of a cross section of the piezoelectric ceramic 1 with a scanning electron microscope (SEM) or a transmission electron microscope (TEM), performing local elemental analysis of Zn and Bi at the inside of the crystal grains 2 and crystal grain boundaries 3 adjoining the crystal grains 2, and calculating the ratio of the number of the first crystal grains 2a to the number of the crystal grains 2 measured.

The piezoelectric ceramic 1 of this embodiment is preferably composed of PZT-type crystal grains 2 and crystal grain boundaries 3 existing between the crystal grains 2, and preferably contains substantially no crystal phase other than the PZT-type crystal, that is, a crystal phase poor in piezoelectric properties or insulation resistance, in terms of maintaining stable insulation resistance or stable piezoelectric properties. The phrase "substantially no crystal phase other than the PZT-type crystal (henceforth referred to as a heterogeneous phase) is contained" means that no heterogeneous phase is found in a lattice image with a transmission electron microscope (TEM) or that in X-ray diffraction (XRD) measurement of a cross section of the piezoelectric ceramic 1 using a Cu$K\alpha$ ray, only peaks derived from the PZT-type crystal are observed and there are substantially no other peaks derived from heterogeneous phases.

The phrase "there are substantially no peaks derived from heterogeneous phases other than the PZT-type crystal in X-ray diffraction measurement using a Cu$K\alpha$ ray" means that the diffraction peak intensity of the heterogeneous phases is 3 or less when the diffraction peak intensity of (111) of the PZT-type crystal is taken as 100. In a diffraction profile obtained as a result of X-ray diffraction (XRD) measurement, a tangent line is drawn at both sides of a diffraction peak and the diffraction peak intensity is expressed by the length to the peak in a direction perpendicular to the tangent line. If the peak intensity of crystal phases other than PZT-type crystal phases low in piezoelectric properties or insulation resistance (heterogeneous phases) is 3 or less relative to the diffraction peak intensity of (111) of the PZT-type crystal when the diffraction peak intensity of (111) of the PZT-type crystal is taken as 100, the piezoelectric ceramic 1 is not affected greatly with respect to its piezoelectric properties and can be suitably used.

The piezoelectric ceramic 1 of this embodiment preferably contains substantially no alkali metal element such as Li and Na and substantially no B (boron). If an alkali metal element, such as Li and Na, and B (boron) are added when firing a PZT-type crystal at low temperature, a liquid phase is formed and sintering properties are improved. However, amorphous phases or crystal phases other than the PZT-type crystal remain in crystal grain boundaries 3 of crystal grains 2 of the PZT-type crystal, and accordingly insulation resistance may decrease with time or piezoelectric properties may deteriorate. In some cases, the alkali metal element, such as Li and Na, and B (boron) may inevitably be contained as impurities in the piezoelectric ceramic 1. Accordingly, the phrase "substantially no alkali metal element, such as Li and Na, and substantially no B (boron) are contained" means that these elements are not added positively during the process of manufacturing the piezoelectric ceramic 1.

In terms of denseness, the piezoelectric ceramic 1 of this embodiment preferably has a porosity of 0.25% or less. By forming such a dense piezoelectric ceramic 1, a density of 7.7 g/cm$^3$ or more, even 7.8 g/cm$^3$ or more is attained, and mechanical loss can be reduced, so that a piezoelectric ceramic 1 which is prone to little deterioration or variation of piezoelectric properties is obtained.

The average grain diameter of the crystal grains 2 in the piezoelectric ceramic 1 of this embodiment is preferably 1.0 to 4.0 µm. If the average grain diameter of the crystal grains 2 is excessively small, the piezoelectric properties deteriorate. If the average grain diameter is excessively large, the hysteresis becomes larger and the piezoelectric ceramic becomes prone to generate heat when driven as an electronic component. Adjusting the average grain diameter of the crystal grains 2 to a range of 1.0 to 4.0 µm makes it possible to maintain necessary piezoelectric properties and inhibit heat generation when the piezoelectric ceramic is driven as an electronic component.

The piezoelectric ceramic 1 includes the crystal grains 2 including a lead zirconate titanate-type crystal containing Zn and Bi and the crystal grain boundaries 3. The crystal grains 2 are of a composite perovskite-type compound, and it is desirable that the crystal grains 2 contain Sb, Cu, Ni, and Nb in addition to Pb, Zr, Ti, Zn, and Bi as metal components, and it is desirable that the crystal grains 2 further contain at least one of Sr and Ba if needed.

The composition of the piezoelectric ceramic 1 is represented by a first component represented by the following composition formula and a second component composed of a Bi oxide and a Zn oxide. Here, M represents at least one element of Cu and Ni.

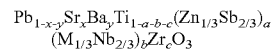  First component:

In the composition formula of the first component, x, y, a, b, and c satisfy the following relational expressions:

$0 \leq x \leq 0.14$, $0 \leq y \leq 0.14 (x+y \geq 0.04)$, $0.01 \leq a \leq 0.12$, $0 \leq b \leq 0.015$, and $0.42 \leq c \leq 0.58$.

When the mass ratio of the second component relative to 100% by mass of the first component is expressed as $\alpha$ %, $\alpha$ is not less than 0.1 and not more than 2.0. While $\alpha$ is defined as the total amount of Zn and Bi as the second component in terms of oxides (ZnO and Bi$_2$O$_3$, respectively), it may be an amount in terms of a composite oxide of Zn and Bi, such as Bi$_{38}$ZnO$_{58}$, Bi$_{38}$ZnO$_{60}$, Bi$_{48}$ZnO$_{73}$, and BiZnO. The ratio between Zn and Bi (Bi/Zn) in the second component is preferably $1 \leq (Bi/Zn) \leq 48$ in element ratio.

Here, the reason why x, y, a, b, c, and $\alpha$ are limited to the ranges recited above will be described. The reason why the amount of substitution of Sr for Pb, x, is limited as $0 \leq x \leq 0.14$ is that it is possible to keep the Curie temperature high by substituting a part of Pb by Sr. The reason why the amount of substitution of Ba for Pb, y, is limited as $0 \leq y \leq 0.14$ is that it is possible to maintain the Curie temperature high and obtain a high piezoelectric strain constant d$_{31}$ by substituting a part of Pb by Ba.

The reason why the amount of substitution of (Zn$_{1/3}$Sb$_{2/3}$) for Ti, a, is limited as $0.01 \leq a \leq 0.12$ is that it is possible to obtain a large piezoelectric strain constant d$_{31}$ and a large piezoelectric output constant g$_{31}$, to maintain the Curie temperature high, and to maintain a small dielectric loss. When the piezoelectric ceramic 1 of this embodiment is used as a piezoelectric actuator, a large piezoelectric strain constant can be obtained by setting a as $0.05 \le a \le 0.12$, and when it is used as a piezoelectric sensor, a large piezoelectric output constant $g_{31}$ can be obtained by setting a as $0.01 \le a \le 0.05$.

By limiting the amount of substitution of $(M_{1/3}Nb_{2/3})$ for Ti, b, as $0 \le b \le 0.015$, a large coercive electric field can be achieved while inhibiting drop of a piezoelectric d constant. While Ni and Cu are used as M, when Cu is used as M, a piezoelectric ceramic 1 with a large coercive electric field can be formed while maintaining a particularly high piezoelectric d constant, and deterioration in displacement can be inhibited. It is particularly preferable to limit b as $0.002 \le b \le 0.01$.

In a piezoelectric ceramic 1 containing PZT as a main component, there is an MPB (morphotropic phase boundary) that exhibits a maximum value of a piezoelectric strain constant when the solid solution ratio of $PbZrO_3$ to $PbTiO_3$ is varied. When the piezoelectric ceramic 1 of this embodiment is used as a piezoelectric actuator, this MPB and a composition close thereto are used. Since this MPB varies depending on the values of x, y, a, and b, the value of c was determined within a composition range where an MPB can be captured within the composition ranges of x, y, a and b.

The reason why the mass ratio α (%) of the second component (Zn oxide and Bi oxide) to the first component is adjusted to $0.1 \le \alpha \le 2.0$ is that in this range, a Zn oxide and a Bi oxide form a liquid phase during firing to wet crystal grains 2 including a PZT-type crystal, and the sintering properties are enhanced, so that the whole of the ceramic is sintered uniformly and warp and deformation can be reduced even with a plate-shaped piezoelectric ceramic 1 that is small in thickness and large in area, and Zn and Bi dissolve in a PZT-type crystal after sintering, so that piezoelectric properties can be improved. The ratio of Zn to Bi (Bi/Zn) is preferably adjusted to $1 \le (Bi/Zn) \le 48$ in element ratio. Use of such a ratio allows the second component to form a liquid phase at low temperature and makes it possible to achieve uniform sintering of the whole ceramic.

The piezoelectric ceramic 1 of this embodiment can be prepared as follows. First, a calcined powder of a PZT-type crystal containing Zn is prepared.

Specifically, for example, powders of PbO, $ZrO_2$, $TiO_2$, and ZnO as feedstock and, optionally, powders of $Sb_2O_3$, CuO, NiO, $Nb_2O_5$, $SrCO_3$, and $BaCO_3$ are weighed and mixed. Subsequently, the mixture is dehydrated, dried, and then calcined at a maximum temperature of 850 to 950° C. for 1 to 3 hours. The resulting calcined powder of the PZT-type crystal is a calcined powder containing the first component. The calcined powder obtained is milled again with a ball mill or the like so as to bring the average grain diameter $D_{50}$ into a range of 0.5 to 0.7 μm, for example.

During the calcination step, it is preferable to adjust the degree of formation of a PZT-type crystal appropriately. As an index for indicating a PZT-type crystal, the peak intensity $I_1$ of a peak (101) ($2\theta \approx 30°$) and the peak intensity $I_2$ of a peak (111) ($2\theta \approx 38°$) of a PZT-type crystal are used. In the X-ray diffraction (XRD) measurement of a calcined powder using a CuKα ray, the intensity ratio of $I_2$ to $I_1$, $I_2/I_1$, is preferably adjusted to 0.130 to 0.160.

If $I_2/I_1$ of a calcined powder is within a range of 0.130 to 0.160, the formation of the PZT-type crystal advances appropriately, and the sintering properties are improved by the addition of the second component (Zn oxide and Bi oxide). Moreover, Zn and Bi are incorporated into a surface layer of the PZT-type crystal along with the grain growth during the sintering stage and they sinter in a temperature range of 900 to 1050° C. without remaining as liquid phase components.

On the other hand, when $I_2/I_1$ of the calcined powder is less than 0.130, the formation of a PZT-type crystal is insufficient and, accordingly, an effect of improving sintering properties may not be obtained even if the second component (Zn oxide and Bi oxide) is added. When $I_2/I_1$ of the calcined powder is larger than 0.160, the formation of a PZT-type crystal excessively advances and, accordingly, Zn and Bi may be difficult to dissolve in a surface layer of the PZT-type crystal even if the second component (Zn oxide and Bi oxide) is added.

The reason why the peak intensity $I_1$ of a peak (101) ($2\theta \approx 30°$) and the peak intensity $I_2$ of a peak (111) ($2\theta \approx 38°$) of a PZT-type crystal are used is that it is believed that other peaks vary in peak position or pattern profile with change of the degree of formation (crystal phase) whereas the peak (101) ($2\theta \approx 30°$) and the peak (111) ($2\theta \approx 38°$) only vary in the intensity ratio and do not vary in peak position or pattern profile even if the degree of formation is varied, and therefore these peaks are best suited to indicate the degree of formation of a PZT-type crystal.

Next, powders of the second component (Zn oxide and Bi oxide, for example, ZnO and $Bi_2O_3$) are weighed and mixed with a calcined powder of a PZT-type crystal. As to the second component, the respective powders thereof may be added to a calcined powder, or a mixed powder prepared by mixing only the second component powders beforehand may be added to a calcined powder. Moreover, it is also permitted to synthesize a composite oxide containing Zn and Bi (henceforth referred to as a BZ oxide) by calcining the second component and then add the composite oxide to a calcined powder. In the case where the BZ oxide is synthesized, the synthesis can be performed by mixing prescribed amounts of Zn oxide and Bi oxide, dehydrating and drying the resulting mixture, and then calcining the mixture, for example, in the air at 600 to 720° C. for 1 to 3 hours. The average grain diameter $D_{50}$ of the second component is preferably adjusted to a range of 0.5 to 0.7 μm, especially, so as to be smaller than the average grain diameter ($D_{50}$) of the calcined powder of a PZT-type crystal, by using a ball mill or the like.

The calcined powder of a PZT-type crystal to which the second component have been added is mixed with a binder, and then formed into a desired shape using a well-known forming method, such as press forming and sheet forming such as a doctor blade method.

The prepared compact is fired at 900 to 1050° C. in the atmosphere. Thereby, Zn and Bi dissolve in the surface layer of a crystal grain 2 of the PZT-type crystal in the piezoelectric ceramic 1.

Conventionally, Li, B, and the like, which form a liquid phase, have been added in order to fire a PZT-type crystal at low temperature. A piezoelectric ceramic prepared using such additives can be fired at low temperature, but its insulation resistance drops with time or its piezoelectric properties are deteriorated due to the presence of an amorphous phase or a crystal phase other than the PZT-type crystal in grain boundaries of crystal grains of the PZT-type crystal. As described in Patent Document 3, even if $Bi_2O_3$, which dissolves in a PZT-type crystal, is used as an additive, it is difficult to sinter the whole of a ceramic uniformly and, especially, a thin plate-shaped piezoelectric ceramic is prone to develop warp or deformation because the liquid phase formation temperature of $Bi_2O_3$ is relatively high, i.e. about 820° C. In the disclosure of Patent Document 3, since a PZT crystal containing no Bi is synthesized and only $Bi_2O_3$ is added as an auxiliary agent to the PZT crystal, Bi, which is not contained in the PZT crystal, dissolves uniformly not only in the surface layer of a crystal grain 2 but also in the inside thereof to yield a product having no difference in Bi content between the area including crystal grain boundaries 3 and the inside of the crystal grain 2.

The piezoelectric ceramic 1 of this embodiment exhibits great sintering properties and forms a dense material having a porosity of 0.25% or less and a density of 7.7 g/cm$^3$ or more even if it is fired at a low temperature of 900 to 1050° C. because a Zn oxide and a Bi oxide, which are a second component, form a liquid phase to wet crystal grains 2 of a PZT-type crystal. Moreover, Zn and Bi that have formed a liquid phase dissolve in a surface layer of the crystal grains 2 of the PZT crystal after the sintering, so that a piezoelectric ceramic 1 in which the thickness of crystal grain boundaries 3 is 10 nm or less (about 1 to 5 nm) is formed. Accordingly, the piezoelectric ceramic 1 is a material including first crystal grains 2a, namely, first crystal grains 2a being smaller in the content of at least one element of Zn and Bi than an area including crystal grain boundaries 3 at the inside of the crystal grains 2 of the PZT-type crystal, in other words, first crystal grains 2a having a layer rich in at least one of Zn and Bi in the vicinity of crystal grain boundaries 3 (the surface layer of the crystal grains 2) of the crystal grains 2 of the PZT-type crystal.

That is, the piezoelectric ceramic 1 is a material excellent in piezoelectric properties, which includes crystal grains 2 of a PZT-type crystal and crystal grain boundaries 3 existing between the crystal grains 2, and in which first crystal grains 2a are included in the crystal grains 2 and substantially no crystal phase other than the PZT-type crystal and substantially no amorphous phase are present at the crystal grain boundaries 3. With this piezoelectric ceramic 1, a volume resistivity of 1 GΩ·m or more is exhibited even after a lapse of 100 hours at 85° C., and insulation degradation during continuous driving can be inhibited.

The second component forms a liquid phase at about 750° C. and the whole of the ceramic starts sintering uniformly at the time of firing. Accordingly, deformation of the piezoelectric ceramic 1 during a sintering process tends to be inhibited even if the piezoelectric ceramic 1 is thin. The piezoelectric ceramic 1 of this embodiment is suitably used especially as a piezoelectric layer of an electronic component having a thickness of 100 μm or less, especially 50 μm or less.

Also when Sb is used as the second component, a liquid phase is formed at low temperature and the same effect is acquired. That is, an oxide containing Bi and Sb or an oxide containing Bi, Zn, and Sb may be used as the second component. These may be used as independent oxides, or a composite oxide synthesized beforehand may be used. An Sb oxide itself is low in its liquidus temperature and is effective in improvement of the sintering properties.

The piezoelectric ceramic 1 can be used as various electronic components, such as a ceramic filter, an ultrasonic oscillator, a piezoelectric buzzer, a piezoelectric ignition unit, an ultrasonic motor, a piezoelectric fan, a piezoelectric sensor, and a piezoelectric actuator. For example, a piezoelectric actuator is an actuator utilizing displacement or power generated through a piezoelectric phenomenon as a mechanical driving source, and it is one of those that are recently attracting attention in the mechatronics field. A piezoelectric actuator is a solid element utilizing a piezoelectric effect, and it has distinguishing characteristics, such as less power consumption, greater response speed, larger amount of displacement, less heat generation, and smaller dimension and weight as compared with conventional electromagnetic actuators having a structure in which a coil is wound around a magnetic material. Especially, a multi-layer piezoelectric actuator from which larger displacement or larger generated force can be obtained at lower voltages is practically used for automatically focusing a camera for opening and closing a fuel injection valve of a vehicle-installed injector and as an acoustic component, such as a piezoelectric loudspeaker.

Figure 2:
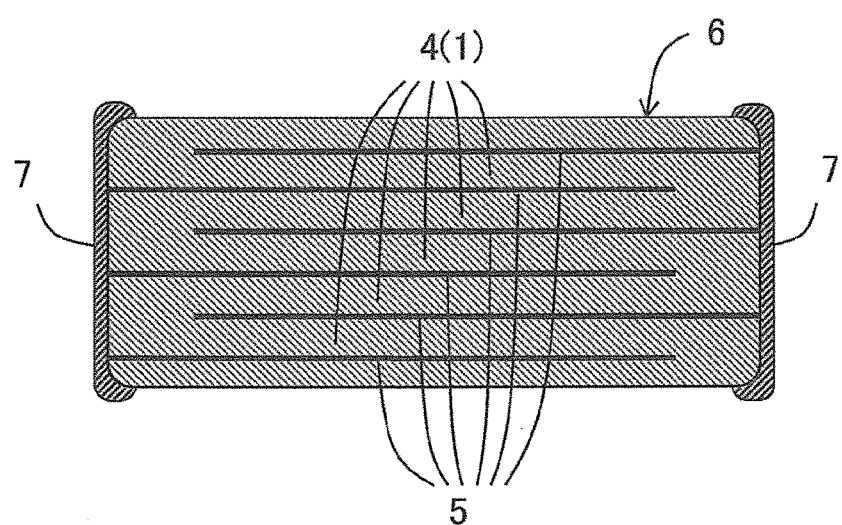
FIG. 2 is a schematic cross-sectional view illustrating one embodiment of an electronic component.

One embodiment of an electronic component is illustrated in FIG. 2. The electronic component of this embodiment includes a stack 6 that is constituted by stacking piezoelectric layers 4 including a piezoelectric ceramic 1 and internal electrode layers 5 alternately one on another. The internal electrode layers 5 are connected with each other by the external electrodes 7 formed at both side surfaces of the stack 6.

In the electronic component of this embodiment, the internal electrode layers 5 contain Ag as a main component and may contain Pd within a range of up to 35% by mass, even within a range of up to 30% by mass in addition to Ag. Since the piezoelectric ceramic 1 of the present invention is sintered at a low temperature of 900 to 1050° C., even such an internal electrode material affords an electronic component which is dense, i.e., has a porosity of 0.25% or less and which is excellent in piezoelectric properties. The internal electrode layers 5 allow ceramic grains to exist therein.

The electronic component of this embodiment can be used as an electronic component with a desired shape and desired dimensions without being processed after firing because of its small deformation caused by firing.

Such an electronic component may be produced as follows. A mixed material of a calcined powder of a PZT-type crystal containing a first component and a powder containing a second component (Zn oxide and Bi oxide) is formed into a green sheet using a well-known sheet forming method, and then an internal electrode paste is applied to the green sheet to form an internal electrode pattern. A plurality of green sheets on which such an internal electrode pattern has been formed are stacked, and finally, a plurality of green sheets on which an internal electrode pattern has not been formed are stacked to form a multi-layer compact, which is then fired at 900 to 1050° C. in the atmosphere.

A piezoelectric layer 4 fired includes crystal grains 2 of a PZT-type crystal and crystal grain boundaries 3 existing between the crystal grains 2. The crystal grains 2 include first crystal grains 2a, and substantially no crystal phase other than PZT-type crystals and substantially no amorphous phase are present at the crystal grain boundaries 3.

Figure 3A:
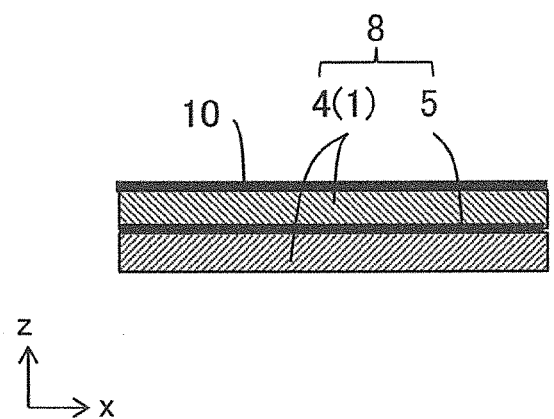
FIG. 3(a) is a schematic cross-sectional view of a piezoelectric substrate.

The electronic component of this embodiment electronic can also be used, for example, as a piezoelectric substrate 8 having an area of 40×30 mm and a thickness of 40 μm. This piezoelectric substrate 8 has a piezoelectric layer 4 including a piezoelectric ceramic 1 and an internal electrode layer 5 as illustrated in the schematic cross-sectional view of FIG. 3 (a), and is used, for example, with a surface electrode 10 formed on the surface of the piezoelectric layer 4. Thus, the piezoelectric substrate 8 large in area and small in thickness shrinks nonuniformly on sintering and tends to suffer from deformation such as warp due to the influence of the internal electrode layer 5, for example. In order to make it easy to explain, depiction is made with enlargement in the z direction of the coordinate axes in FIG. 3(a).

Figure 3B:
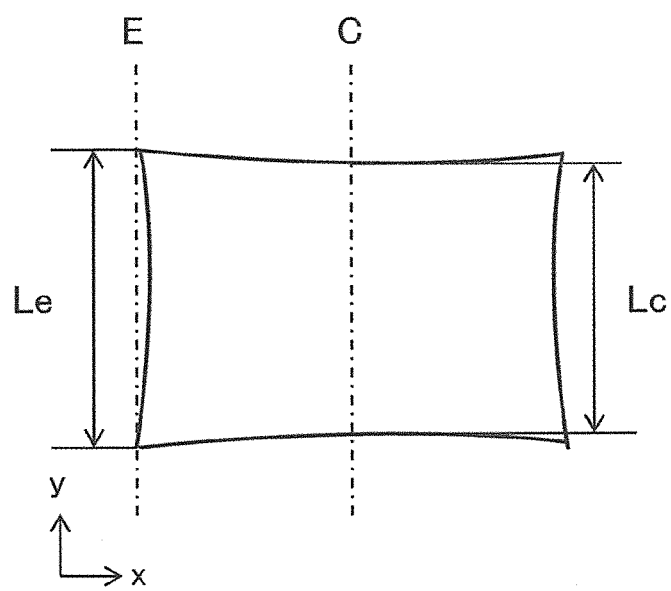
FIG. 3(b) is an explanatory view relating to the amount of deformation of a piezoelectric substrate.

For example, a difference ΔL between Lc and Le is used as an index of deformation in a piezoelectric substrate 8 depicted in the plan view of FIG. 3(b) where the length of a main surface of the piezoelectric substrate 8 measured on the bisector C that bisects the piezoelectric substrate 8 along the x axis direction is Lc, and the length of the piezoelectric substrate 8 measured on a line E that is located on either of both ends of the piezoelectric substrate 8 taken in the x axis direction and that is parallel to the bisector C is Le. When, for example, a 40 µm thick piezoelectric substrate 8 with a size of 40×30 mm is produced using a conventional piezoelectric ceramic to be fired at high temperature or a piezoelectric ceramic containing an alkali metal component added therein, ΔL of the piezoelectric substrate 8 is several hundred micrometers or more at the time of firing up and processing is required after the firing. Conversely, in the case of a piezoelectric substrate 8 including the piezoelectric ceramic 1, ΔL is less than 100 µm. (ΔL/Lc is 1% or less) and, accordingly, no processing is required after the firing. Lc and Le may be measured using a caliper or an image size measuring device (for example, a CNC image measuring device).

EXAMPLES

Using powders of PbO, $ZrO_2$, $TiO_2$, ZnO, $Sb_2O_3$, $SrCO_3$, $BaCO_3$, CuO, and $Nb_2O_5$ as feedstock powders, the powders were weighed such that the first component might have the composition of Table 1 with the formula $Pb_{1-x-y}Sr_xBa_y$ $Ti_{1-a-b-c}(Zn_{1/3}Sb_{2/3})_a(M_{1/3}Nb_{2/3})_bZr_cO_3$, and then wet mixed with a ball mill for 24 hours. M is Cu or Ni. Subsequently, this mixture was dehydrated, dried, and then calcined at the calcination temperature shown in Table 1 for 3 hours, and the calcined material was wet ground again with a ball mill for 24 hours, thereby yielding a calcined powder having a $D_{50}$ of 0.5 to 0.7 µm.

Then, the additives with a $D_{50}$ of 0.5 to 0.7 µm shown in Table 1 were added in the amount (% by mass) shown in Table 1 relative to 100% by mass of the first component and an organic binder was mixed therewith, and then a 30 µm thick green sheet was prepared by a doctor blade method. On the green sheet prepared was screen printed an internal electrode paste containing Ag and Pd, and 15 green sheets with an internal electrode paste printed thereon were stacked and a green sheet with no internal electrode paste printed thereon was stacked lastly. Thus, a multi-layer compact was prepared. The mass ratio between the metal components of the internal electrode paste was adjusted to Ag:Pd=95:5.

The multi-layer compact prepared was debindered and then fired in the atmosphere under the firing conditions shown in Table 1, followed by cooling. Thus, a stack with internal electrodes exposed alternately in its both end surfaces was obtained.

A multi-layer piezoelectric actuator that is an electronic component was obtained by forming an external electrode through burning of an Ag paste on both end surfaces of the resulting stack, and then performing a polarization treatment. In this multi-layer piezoelectric actuator, the thickness per layer of the piezoelectric layers (the thickness between the electrodes) was 25 µm.

The porosity of the piezoelectric layer (the piezoelectric ceramic) was determined by polishing across section of the stack, observing the polished surface by using a scanning electron microscope (SEM), and image processing a photograph of the piezoelectric layer. A SEM photograph of the polished surface thermally etched (in the atmosphere, at 950° C. for 3 hours) was image processed, and the average grain diameter of crystal grains in the piezoelectric layer was determined with the equivalent circle diameter of the cross-sectional area determined from the profile of a crystal grain constituting the piezoelectric layer regarded as the diameter of the crystal grain. As to the density of the piezoelectric layer (piezoelectric ceramic), the bulk density of the stack was determined according to the Archimedes method, and the bulk density was regarded as the density of the piezoelectric ceramic.

The composition of the stack was confirmed by ICP emission spectroscopic analysis. The composition agreed with the composition at preparation within a margin of error.

Figure 4:
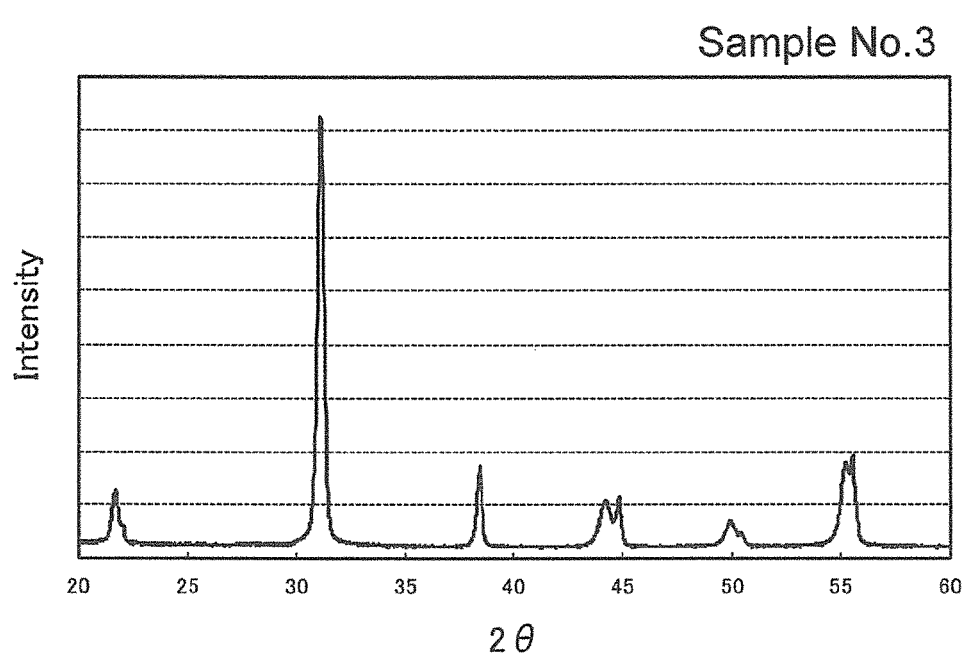
FIG. 4 is a diagram showing the X-ray diffraction result of Sample No. 3.
Figure 5:
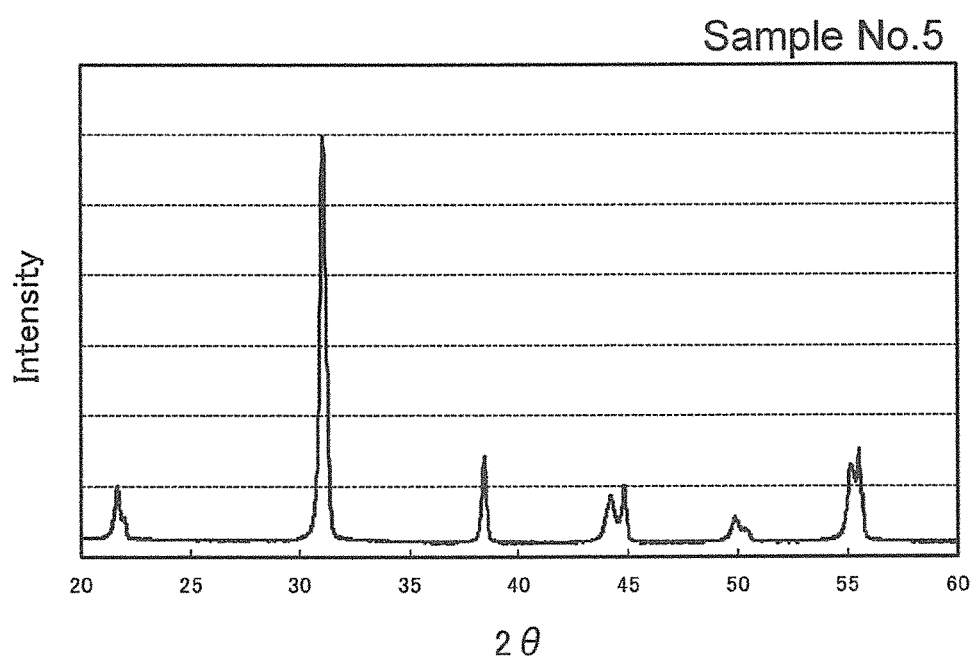
FIG. 5 is a diagram showing the X-ray diffraction result of Sample No. 5.

As to whether there were crystal phases other than the PZT-type crystal in the piezoelectric layer, a judgment that there were no crystal phases other than the PZT-type crystal was made when there were substantially no peaks caused by crystals other than the PZT-type crystal peak in the X-ray diffraction (XRD) measurement of the stack using a Cukα ray. The X-ray diffraction measurement result of Sample No. 3 is shown in FIG. 4 and the X-ray diffraction measurement result of Sample No. 5 is shown in FIG. 5.

The distribution of Bi and Zn of the piezoelectric layer was checked using a transmission electron microscope (TEM). For 10 arbitrary crystal grains, elemental analysis was performed at a crystal grain boundary and at the inside of a crystal grain 10 nm apart from the crystal grain boundary. The results are shown in Table 1. In Table 1, the ratio of the first crystal grains, in which the contents Cb(Zn) and Cb(Bi) of Zn and Bi in an area including a crystal grain boundary are greater than the contents of Ci(Zn) and Ci(Bi) in the inside of the crystal grain, of the crystal grains measured is shown with errors in measurements taken into account. The average values of Cb(Zn)/Ci(Zn) and Cb(Bi)/Ci(Bi) in the first crystal grains checked were calculated. The results are shown in Table 1.

In the deterioration test of the insulation resistance of a piezoelectric layer (piezoelectric ceramic), a direct electric field of 2 kV/mm was applied to an electronic component in an isothermal bath at 85° C. The insulation resistance of the electronic component at 85° C. was measured and it was converted into a volume resistivity. A volume resistivity at an early stage of the test and that measured 100 hours later are shown in Table 1.

As to piezoelectric properties, an aging treatment was applied at 100° C. to a polarized electronic component, and then a specimen with a size of 12×3 mm was cut out. The piezoelectric strain constant $d_{31}$ of the electronic component was determined by performing a polarization treatment through application of a DC voltage to two surface electrodes formed on both sides of the specimen, and then measuring a vibration mode in the longitudinal direction. The piezoelectric strain constant $d_{31}$ determined is shown in Table 1.

For the deformation of a piezoelectric ceramic, a piezoelectric substrate for deformation measurement was prepared. A 25 µm thick green sheet was prepared by a doctor blade method, and using an internal electrode paste, an internal electrode paste was printed on the whole area of 14.8 mm×28 mm on the green sheet. A green sheet on which the internal electrode paste had not been printed was stacked on the printed side of the green sheet on which the internal electrode paste had been printed, and the stack was subjected to debindering and then fired, thereby yielding a piezoelectric substrate. The firing conditions were the same as the conditions under which the multi-layer piezoelectric actuator was prepared. The thickness of the resulting piezoelectric substrate was 42 µm. As to the amount of deformation of the piezoelectric substrate, a difference ΔL between Lc and Le was calculated where the length of the piezoelectric substrate measured on the bisector C that bisects the longer sides of the piezoelectric substrate is denoted by Lc, and the greater one of the lengths of the piezoelectric substrate measured on lines E which are located on both ends of the longer sides of the piezoelectric substrate and which are parallel to the bisector C is denoted by Lc, in a fired-up state. The amount of deformation of the piezoelectric substrate was assessed using a ratio of ΔL to Lc (ΔL/Lc). The measurement of the length of the piezoelectric substrate was performed using a CNC image measuring device. The results are shown in Table 1.

TABLE 1

| | | | Sample No. | | | | | | |
|---|---|---|---|---|---|---|---|---|---|
| | | | 1 | 2 | 3 | 4 | 5 | 6 | 7 |
| First component*1 | x | — | 0.06 | 0 | 0 | 0 | 0 | 0 | 0 |
| | y | — | 0 | 0.07 | 0.07 | 0.07 | 0.07 | 0.07 | 0.07 |
| | a | — | 0.1 | 0.095 | 0.1 | 0.1 | 0.1 | 0.1 | 0.1 |
| | M | — | Cu | Cu | Cu | Cu | Cu | Cu | Cu |
| | b | — | 0.005 | 0.005 | 0.005 | 0.005 | 0.005 | 0.005 | 0.005 |
| | c | — | 0.465 | 0.435 | 0.43 | 0.425 | 0.425 | 0.425 | 0.425 |
| Calcination condition | Temperature | °C. | 920 | 920 | 920 | 920 | 920 | 920 | 920 |
| | Time | Hr | 3 | 3 | 3 | 3 | 3 | 3 | 3 |
| Additive (Second component) | Kind*2 | — | $Bi_2O_3$: 1 ZnO: 2 | $Bi_2O_3$: 1 ZnO: 2 | BiZnO | $Bi_2O_3$: 1 ZnO: 1 | $Bi_2O_3$: 1 ZnO: 1 | $Bi_2O_3$: 1 ZnO: 1 | $Bi_2O_3$: 3 ZnO: 2 |
| | α*3 | % by mass | 0.5 | 0.5 | 0.5 | 0.1 | 0.5 | 2 | 0.5 |
| Firing condition | Temperature | °C. | 970 | 970 | 970 | 1020 | 970 | 900 | 950 |
| | Time | Hr | 3 | 3 | 3 | 3 | 3 | 3 | 3 |
| Density | | g/cm³ | 7.93 | 7.95 | 7.94 | 7.95 | 7.95 | 7.95 | 7.97 |
| Porosity | | % | 0.22 | 0.15 | 0.13 | 0.18 | 0.14 | 0.03 | 0.12 |
| Average grain diameter | | μm | 2.5 | 2.2 | 2.5 | 2.2 | 2.7 | 4.2 | 2.8 |
| Crystal phase (heterogeneous phase) | Kind | — | None | None | None | None | None | None | None |
| Ratio of first grain | | % | 100 | 80 | 90 | 100 | 90 | 90 | 100 |
| Zn content ratio*4 | Cb/Ci | — | 1.10 | 1.05 | 1.04 | 1.00 | 1.00 | 1.02 | 1.00 |
| Bi content ratio*4 | Cb/Ci | — | 1.06 | 1.00 | 1.06 | 1.01 | 1.07 | 1.08 | 1.07 |
| Volume resistivity | Initial | Ω·m | 95G | 80G | 110G | 95G | 83G | 80G | 90G |
| | 100 Hr later | Ω·m | 95G | 70G | 110G | 94G | 82G | 77G | 89G |
| Piezoelectric properties | d31 | p·m/V | 255 | 295 | 260 | 262 | 265 | 251 | 276 |
| Dielectric constant | | — | 3338 | 3950 | 3600 | 3448 | 3550 | 4010 | 3860 |
| Deformation of ceramic | | % | 0.08 | 0.1 | 0.03 | 0.03 | 0.04 | 0.07 | 0.02 |

| | | | Sample No. | | | | | | |
|---|---|---|---|---|---|---|---|---|---|
| | | | 8 | 9 | 10 | 11 | 12 | 13 | 14 |
| First component*1 | x | — | 0 | 0 | 0 | 0.05 | 0 | 0 | 0 |
| | y | — | 0.07 | 0.07 | 0.07 | 0.02 | 0.07 | 0.07 | 0.07 |
| | a | — | 0.1 | 0.1 | 0.1 | 0.1 | 0.1 | 0.1 | 0.1 |
| | M | — | — | Cu | Ni | Cu | Cu | Cu | Cu |
| | b | — | — | 0.005 | 0.005 | 0.005 | 0.005 | 0.005 | 0.005 |
| | c | — | 0.425 | 0.425 | 0.425 | 0.425 | 0.425 | 0.425 | 0.425 |
| Calcination condition | Temperature | °C. | 920 | 920 | 920 | 920 | 920 | 920 | 920 |
| | Time | Hr | 3 | 3 | 3 | 3 | 3 | 3 | 3 |
| Additive (Second component) | Kind*2 | — | $Bi_2O_3$: 2 ZnO: 1 | $Bi_2O_3$: 2 ZnO: 1 $Sb_2O_3$: 1 | $Bi_2O_3$: 1 ZnO: 2 | BiZnO | $Bi_2O_3$ | None | $Li_2O$: 1 $B_2O_3$: 1 |
| | α*3 | % by mass | 0.5 | 0.4 | 0.5 | 0.5 | 0.5 | None | 0.5 |
| Firing condition | Temperature | °C. | 950 | 970 | 970 | 970 | 970 | 1100 | 990 |
| | Time | Hr | 3 | 3 | 3 | 3 | 3 | 3 | 3 |
| Density | | g/cm³ | 7.98 | 7.96 | 7.96 | 7.96 | 7.93 | 7.95 | 7.84 |
| Porosity | | % | 0.11 | 0.13 | 0.11 | 0.11 | 0.15 | 0.15 | 0.32 |
| Average grain diameter | | μm | 3.1 | 2.7 | 2.3 | 2.4 | 2.5 | 3.2 | 3 |
| Crystal phase (heterogeneous phase) | Kind | — | None | None | None | None | None | None | Amorphous |
| Ratio of first grain | | % | 90 | 100 | 100 | 100 | 0 | 0 | 0 |
| Zn content ratio*4 | Cb/Ci | — | 1.00 | 1.00 | 1.01 | 1.10 | — | — | — |
| Bi content ratio*4 | Cb/Ci | — | 1.08 | 1.01 | 1.01 | 1.06 | — | — | — |
| Volume resistivity | Initial | Ω·m | 80G | 115G | 122G | 120G | 82G | 20G | 30G |
| | 100 Hr later | Ω·m | 77G | 110G | 112G | 120G | 81G | 2.5G | 10M |
| Piezoelectric properties | d31 | p·m/V | 288 | 280 | 256 | 287 | 260 | 277 | 125 |
| Dielectric constant | | — | 3790 | 3780 | 3800 | 3850 | 3500 | 3970 | 2320 |
| Deformation of ceramic | | % | 0.01 | 0.04 | 0.05 | 0.01 | 1.5 | 2.1 | 3.8 |

*1 Composition formula $Pb_{1-x-y}Sr_xBa_yTi_{1-a-b-c}(Zn_{1/3}Sb_{2/3})_a(M_{1/3}Nb_{2/3})_bZr_cO_3$
*2 A ratio of a plurality of components indicates a molar ratio.
*3 α is a mass ratio relative to the first component.
*4 Ci is a measured value of the inside of a crystal grain, and Cb is a measured value of an area including a crystal grain boundary.

As shown in Table 1, the samples in which first crystal grains, namely, crystal grains in which the content of at least one of Zn and Bi was larger in crystal grain boundaries adjoining the crystal grains than inside the crystal grains, were present in the piezoelectric layer (Sample Nos. 1 to 11) showed the following results: they were densified to a porosity of 0.25% or less even when they were fired at low temperature; their piezoelectric properties were high and a piezoelectric strain constant $d_{31}$ was 250 p·m/V or more; their initial volume resistivity was 80 GΩ·m or more; the deterioration with time of their insulation resistance was small as indicated by a volume resistivity of 70 GΩ·m or more even after a lapse of 100 hours at 85° C.; and the deformation of a piezoelectric substrate was small. Especially, the samples having a ratio of the first crystal grains of 90% or more had a ratio of the amount of deformation of 0.1% or less. The samples containing Cu in their piezoelectric layers maintained high piezoelectric d constants and had greater coercive electric fields than the samples having similar compositions but containing no Cu.

REFERENCE SIGNS LIST

1: Piezoelectric ceramic
2: Crystal grain of PZT-type crystal
2a: First crystal grain
2b: Second crystal grain
3: Crystal grain boundary
4: Piezoelectric layer
5: Internal electrode layer
6: Stack
7: External electrode
8: Piezoelectric substrate
10: Surface electrode

The invention claimed is:

1. A piezoelectric ceramic comprising a plurality of crystal grains including a lead zirconate titanate-type crystal containing Zn and Bi, and crystal grain boundaries present between a plurality of the crystal grains,
wherein a plurality of the crystal grains include first crystal grains, and
wherein the first crystal grains have a content of at least one element of Zn and Bi present in the inside of the first crystal grains that is smaller than the content of the at least one element present in an area including the crystal grain boundaries that are in contact with the first crystal grains.

2. The piezoelectric ceramic according to claim 1, wherein substantially no amorphous phase and substantially no crystal phase other than the lead zirconate titanate-type crystal are present at the crystal grain boundaries.

3. The piezoelectric ceramic according to claim 1, wherein the ratio of the number of the first crystal grains in a plurality of the crystal grains is 90% or more.

4. The piezoelectric ceramic according to claim 1, wherein the piezoelectric ceramic has a porosity of 0.25% or less.

5. The piezoelectric ceramic according to claim 1, wherein a plurality of the crystal grains have an average grain diameter of 1.0 to 4.0 μm.

6. An electronic component comprising a piezoelectric body containing the piezoelectric ceramic according to claim 1, and an electrode layer.

7. The electronic component according to claim 6, wherein the electrode layer comprises Ag as a main component.

8. The electronic component according to claim 7, wherein the electrode layer further comprises 35% by mass or less of Pd.

* * * * *